(12) United States Patent
Jasa et al.

(10) Patent No.: US 7,782,116 B2
(45) Date of Patent: Aug. 24, 2010

(54) POWER SUPPLY INSENSITIVE VOLTAGE LEVEL TRANSLATOR

(75) Inventors: Hrvoje Jasa, Scarborough, ME (US); Steven M. Macaluso, Scarborough, ME (US); Julie Stultz, Scarborough, ME (US); Roy L. Yarbrough, Hiram, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 168 days.

(21) Appl. No.: 12/205,178

(22) Filed: Sep. 5, 2008

(65) Prior Publication Data

US 2010/0060337 A1 Mar. 11, 2010

(51) Int. Cl.
*H03K 17/16* (2006.01)
(52) U.S. Cl. .................................. 327/389; 327/427
(58) Field of Classification Search ................ 327/389, 327/376, 377, 407, 408, 427, 428
See application file for complete search history.

(56) References Cited

U.S. PATENT DOCUMENTS

| | | | | |
|---|---|---|---|---|
| 5,350,951 A | * | 9/1994 | Adachi | 327/546 |
| 5,963,080 A | * | 10/1999 | Miske et al. | 327/534 |
| 6,163,199 A | * | 12/2000 | Miske et al. | 327/434 |
| 7,061,274 B2 | * | 6/2006 | George | 326/86 |
| 7,492,207 B2 | * | 2/2009 | Cornelissens et al. | 327/365 |

* cited by examiner

*Primary Examiner*—Hai L Nguyen
(74) *Attorney, Agent, or Firm*—Cesari and McKenna, LLP; Edwin H. Paul, Esq.

(57) ABSTRACT

A circuit is described that when the power supply to circuits that control a pass transistor is at zero volts, the pass transistor configured as a voltage level translator remains off regardless of the voltages and changes in voltages at the ports connected to the pass transistor. Cross coupled transistors provide a mechanism where the higher of the port voltages is available to power circuitry that maintains the control input of the pass transistor in the off condition. The voltages at the ports may rise and fall relative to each other, but the control input of the pass transistor will keep the pass transistor off.

8 Claims, 1 Drawing Sheet

POWER SUPPLY INSENSITIVE VOLTAGE LEVEL TRANSLATOR

BACKGROUND OF THE INVENTION

1. Field of the Invention

The present invention relates to a level translation circuit that employs a pass switch device used for port isolation, and, more particularly, to level translation circuits that provide a two way path for signals between circuits having different power supply levels.

2. Background Information

Level translators include a pass device, typically and MOS transistor, with its drain defined as one port and its source defined as a second port. Level translation allows information transfer between, for example, a system powered from +3V connected to one port and one powered by +1.8V to the second port.

Known systems were directed to preserving isolation and operability regardless, inter alia, of power supply sequencing, while lowering power dissipation and increasing speed.

One limitation, however, persists. That limitation is that when the power supply to the pass switch is zero or very low, higher potentials at the ports of pass switch may cause an off pass switch to turn on causing a malfunction or improper logic operation of one or both of the circuits connected to the ports or to the pass switch itself.

The term "connected" as used herein means functionally in contact or coupled where passive or other components may be interspersed that do not affect the functionality of the "connection."

It would be advantageous to ensure that the pass switch off state remains regardless of the voltage at the ports and the power supply for the pass switch itself.

SUMMARY OF THE INVENTION

The present invention provides maintaining the pass switch off condition, when the power supplies of the circuits being isolated present to the ports, voltage levels that exceed that of the pass switch. The present invention evaluates the difference between the port voltages and the pass switch, and ensures that the pass switch off condition remains regardless of the port voltages.

Illustratively, the present invention provides a circuit that selects the voltages at either port of the pass switch and supplies the higher voltage to control the pass switch. In this manner the gate voltage of the pass switch will always be the lower or equal to the voltages at either port, and the off condition of the pass switch will be maintained.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
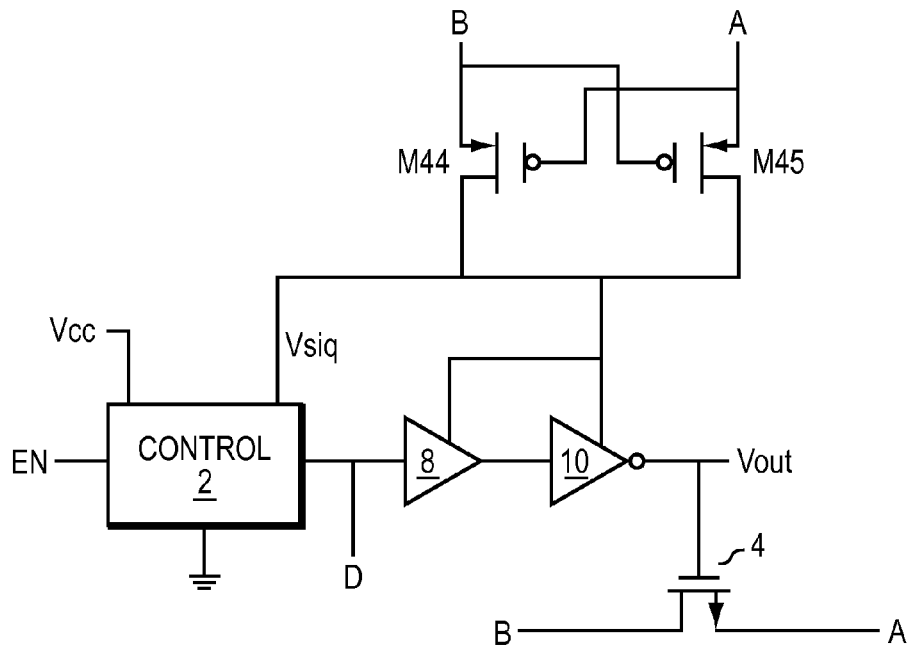
FIG. 1 is a circuit schematic of a level translator and pass switch.

FIG. 1 is a schematic block diagram illustrating the present invention. Here a control circuit 2 ensures that voltage transitions of the ports A and B do not change the off state of the pass switch, the n-type transistor 4, when the power supply to the pass, Vcc, is at zero volts.

In normal operation where Vcc is some positive value, the circuit of FIG. 1 operates as follows: if Vsig were not affected by the control 2 block, then the higher voltage between A and B would appear at Vsig. If A were lower than B, M44 would be on and M45 off. M44 transfers the voltage at B to Vsig, and if the voltage at B were lower than A, M45 would be on transferring the voltage at A to Vsig.

Still in normal operation, in FIG. 1, EN is a low true signal so when EN is high, point D followed Vsig and is the higher of A or B, Vout is low and the transistor 4 is off. When EN is low, D is low, Vout is the higher of A or B and the transistor 4 is on. Buffer 8 is non-inverting and buffer 10 is inverting.

Figure 2:
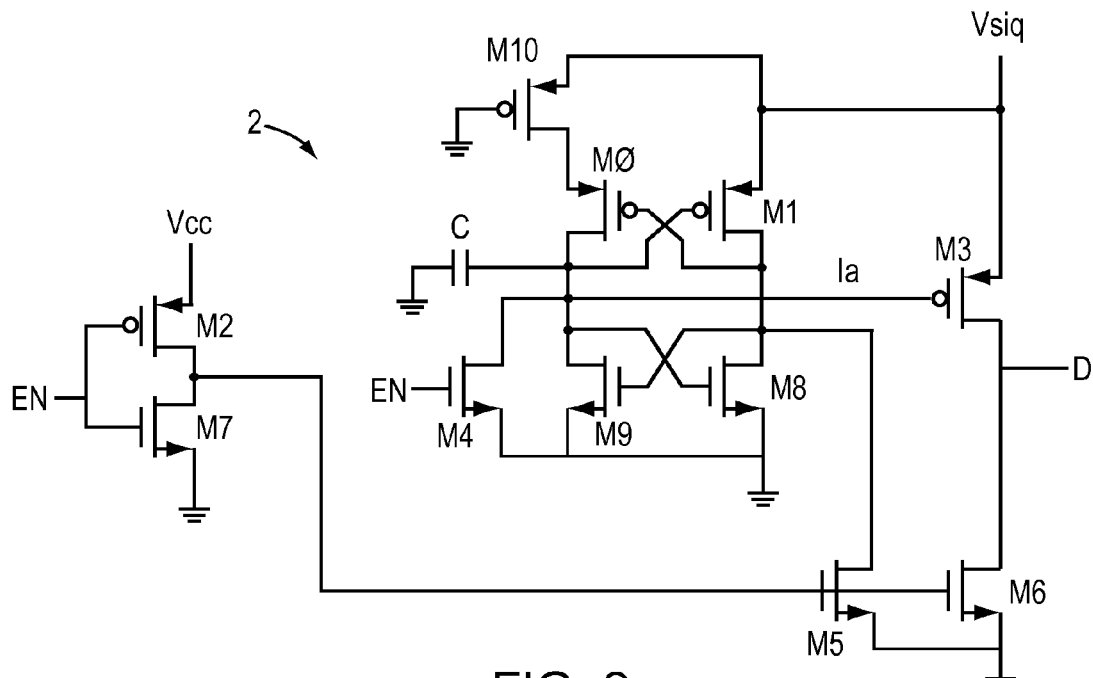
FIG. 2 is a circuit schematic of the control in FIG. 1.

However, if Vcc is zero, the operation calls for the transistor 4 to be off regardless of the voltages at A or B and regardless of the voltage slew rates of A or B. FIG. 2 illustrates a circuit that provides this function.

If Vcc is zero, consider EN to be zero. This will be the case as Vcc is assumed to be powering the circuit producing EN. The gates of M4, M5 and M6 are zero and they are off. M0 and M1 are cross coupled inverters as are M9 and M8. The sizes of these transistors are selected such that the cross coupled inverters will resolve to the point Ia being at zero volts. The size selection will have M0 and M8 smaller (and thus higher on resistances) than M1 and M9. Ia will be low and turn on M3, wherein D will be equal to Vsig.

Note that if EN were high while Vcc is zero, M7 may be on, M5 and M6 off, but M4 would be on and Ia again would be low. M3 would be on and D would still equal Vsig.

In the instance where EN is low and Vcc high Ia will be high, D will be low and the pass transistor will be on. If Vcc then goes low, M5 and M6 will turn off (M4 is already off). M6 was holding D low and D is now released and floating.

In operation, from FIG. 1, Vsig is the higher of A or B, but if these voltages were moving relative to each other very quickly, there may be a fast voltage transition at Vsig. Vsig may drop quickly to near zero and rise quickly back to some positive level. In this instance, with respect to FIG. 2, Ia must remain at zero volts and M3 remains on presenting Vsig to point D.

M10, M0 and the capacitor C form an RC delay that, along with the relative sizes of the cross coupled transistors, ensure the above operation. The capacitor C slows the response of Ia enough to allow the cross coupled gates to resolve the Vsig changes that will maintain Ia low. M10 further slows by increasing the series resistance in the charging path for capacitor C. The capacitor C also inhibits fast edges at Vsig from traversing M0 and latching the cross coupled transistors into the wrong state and thus affecting Ia.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A voltage level translator comprising:

a pass transistor having a control input and two ports or contacts each connected to circuits that transfer signals to each other via the pass transistor when the pass transistor is on, and wherein the signals may be of different voltages;

two cross coupled transistors each having a control input connected to one of the ports of the pass transistor and with outputs from each of the cross coupled transistors connected together to form a first output, wherein the cross coupling is configured to transfer the higher of the port voltages to the first output;

a control circuit having a control output, the control circuit powered by a power voltage, the control circuit connected to the first output;

an inverter with an input and an output, wherein the first output is transferred via the control circuit to the inverter input; and wherein the inverter output is connected to the control input of the pass transistor; and, when the power voltage to the control circuit is at or near zero volts, the inverter output is maintained low holding the pass transistor is off regardless of the value or transitions of the port voltages.

2. The voltage level translator of claim 1 wherein the control circuit of claim 1 comprises: a first transistor with a control input, and an input contact connected to the first output and an output connected to the inverter input;

a latching circuit with an output connected to the first transistor control input; and an input connected to the first output, wherein when the power voltage to the control circuit is low, the latching circuit output is always low regardless of the voltage or the voltage transitions at the first output.

3. The voltage level translator of claim 2 wherein the latching circuit comprises:

a first pair of cross coupled transistors;

a second pair of cross coupled transistors arranged below the first pair of cross coupled transistors; wherein the drains of the first pair are connected to the drains of the second pair of cross coupled transistors, and wherein the sizes of the transistors in the first and the second pair or cross coupled transistors are not uniform and unbalances so that the first and the second pairs of cross coupled transistors will resolve to a known state.

4. The voltage level translator of claim 3, further comprising a capacitor connected to the drains of one transistor from the first pair and one transistor of the second pair of cross coupled transistors, wherein the capacitor slows the voltage rise and fall times such the state of the first and second pairs of cross coupled transistors resolve to and remain in the known state.

5. A process for keeping a voltage level translator, having two ports and a control input, in the off condition when the voltage powering a control circuit, that turns the voltage level translator on or off, falls to or near zero, the process comprising the steps of:

positioning the voltage level translator between two circuits that develop different voltages at each port;

selecting the higher of the voltages at the ports;

presenting the selected voltage to the control circuit; and maintaining the off condition to the voltage translator, when the control circuit has voltage translator off, and then power to the control circuit falls to or near zero.

6. The process of claim 5 further comprising the step of latching the control circuit output.

7. The process of claim 6 further comprising the step of unbalancing the latching circuits so that a known state is resolved.

8. The process of claim 7 wherein the step of unbalancing the latching circuits so that a known state is resolved comprises the step of connecting a capacitor to the latch.

* * * * *